(12) United States Patent
Chen et al.

(10) Patent No.: US 11,005,385 B2
(45) Date of Patent: May 11, 2021

(54) ALTERNATOR AND RECTIFIER THEREOF

(71) Applicant: ACTRON TECHNOLOGY CORPORATION, Taoyuan (TW)

(72) Inventors: Wei-Jing Chen, Taoyuan (TW); Shang-Shu Chung, Taoyuan (TW); Yen-Yi Chen, Taoyuan (TW); Huei-Chi Wang, Taoyuan (TW)

(73) Assignee: ACTRON TECHNOLOGY CORPORATION, Taoyuan (TW)

( * ) Notice: Subject to any disclaimer, the term of this patent is extended or adjusted under 35 U.S.C. 154(b) by 99 days.

(21) Appl. No.: 16/358,731

(22) Filed: Mar. 20, 2019

(65) Prior Publication Data

US 2020/0220477 A1 Jul. 9, 2020

(30) Foreign Application Priority Data

Jan. 8, 2019 (TW) ............................ 108100771 A

(51) Int. Cl.
*H02M 7/217* (2006.01)
*H02K 11/04* (2016.01)
*H02M 1/08* (2006.01)

(52) U.S. Cl.
CPC .......... *H02M 7/217* (2013.01); *H02K 11/046* (2013.01); *H02M 1/08* (2013.01)

(58) Field of Classification Search
CPC .................................................. H02M 7/217
See application file for complete search history.

(56) References Cited

U.S. PATENT DOCUMENTS

| | | | |
|---|---|---|---|
| 8,400,790 B2 | 3/2013 | Zhang et al. | |
| 8,427,801 B2 | 4/2013 | Goerlach et al. | |
| 10,168,718 B1 | 1/2019 | Kuo et al. | |
| 10,454,363 B1 * | 10/2019 | Chung | H02M 1/32 |
| 2016/0036436 A1 | 2/2016 | Hwang et al. | |

(Continued)

FOREIGN PATENT DOCUMENTS

| | | |
|---|---|---|
| TW | 201541847 | 11/2015 |
| TW | I583118 | 5/2017 |

(Continued)

OTHER PUBLICATIONS

"Office Action of Taiwan Counterpart Application", dated Jul. 17, 2019, p. 1-p. 6.

(Continued)

*Primary Examiner* — Hai L Nguyen
(74) *Attorney, Agent, or Firm* — JCIPRNET

(57) ABSTRACT

The disclosure provides an alternator and a rectifier thereof. The rectifier includes a transistor and a gate driving circuit. A control end of the transistor receives a gate voltage. The gate driving circuit generates the gate voltage according to a voltage difference between an input voltage and a rectified voltage. The gate driving circuit detects an initial time point when the voltage difference is smaller than a first preset threshold voltage, provides the gate voltage to turn on the transistor during a first time period after the initial time point, and sets the voltage difference to be equal to a first reference voltage. The gate driving circuit sets the voltage difference to be equal to a second reference voltage through adjusting the gate voltage during a second time period after the first time period.

12 Claims, 11 Drawing Sheets

(56) References Cited

U.S. PATENT DOCUMENTS

| | | |
|---|---|---|
| 2017/0110959 A1 | 4/2017 | Ishimaru et al. |
| 2018/0167000 A1 | 6/2018 | Pidutti et al. |
| 2018/0191152 A1 | 7/2018 | Ishimaru et al. |

FOREIGN PATENT DOCUMENTS

| | | |
|---|---|---|
| TW | 201820762 | 6/2018 |
| TW | I630793 | 7/2018 |

OTHER PUBLICATIONS

"Office Action of French Counterpart Application", dated Jul. 24, 2020, with English translation thereof, pp. 1-15.

\* cited by examiner

ALTERNATOR AND RECTIFIER THEREOF

CROSS-REFERENCE TO RELATED APPLICATION

This application claims the priority benefit of Taiwan application serial no. 108100771, filed on Jan. 8, 2019. The entirety of the above-mentioned patent application is hereby incorporated by reference herein and made a part of this specification.

BACKGROUND

Technical Field

The disclosure relates to an alternator and a rectifier thereof, and more particularly to an alternator and a rectifier thereof for reducing power loss.

Description of Related Art

In an alternator, a rectifier is often used to rectify an alternating current (AC) input voltage and to produce a rectified voltage which may be considered as a direct current (DC) voltage. In the prior art, a diode or a transistor is often used to perform the rectification action of the input voltage. Under an ideal state, the voltage value of the rectified voltage in the negative half cycle should be maintained as equal to a base voltage (for example, 0 volts). However, under a practical situation, as shown in the waveform diagram of the conventional rectified voltage of FIG. 1, the peak value is the rectified voltage of a voltage VP and in a negative half cycle TN thereof, the voltage value of the rectified voltage is lower than the base voltage V0 thereof. In other words, in the negative half cycle TN of the rectified voltage, the phenomenon of power loss occurs, thereby reducing the working efficiency of the system.

SUMMARY

The disclosure provides an alternator and a rectifier thereof for reducing power loss.

The rectifier of the disclosure includes a transistor and a gate driving circuit. The transistor has a first end for receiving an input voltage, a second end for generating a rectified voltage, and a control end for receiving a gate voltage. The gate driving circuit is coupled to the transistor and generates a gate voltage according to a voltage difference between a rectified voltage and an input voltage. The gate driving circuit detects an initial time point when the voltage difference is smaller than a first preset threshold voltage, provides the gate voltage to turn on the transistor during a first time period after the initial time point, and sets the voltage difference to be equal to a first reference voltage. The gate driving circuit gate sets the voltage difference to be equal to a second reference voltage through adjusting the gate voltage during a second time period after the first time period.

In an embodiment of the disclosure, the first reference voltage may be larger than, smaller than, or equal to the second reference voltage.

In an embodiment of the disclosure, the first reference voltage equals to the product of the conductive resistance of the transistor and the current flowing through the transistor.

In an embodiment of the disclosure, the gate driving circuit detects a second time point when the voltage difference rises from the second reference voltage to a second preset threshold voltage during a third time period after the second time period and adjusts the gate voltage to set the transistor to be cut off after the second time point.

In an embodiment of the disclosure, the gate driving circuit includes an operational amplifier, a first switch, and a second switch. The operational amplifier receives the voltage difference and adjusts the voltage according to a first control signal to generate the gate voltage at the output end. The first switch is connected in series between a first voltage and the output end, and is turned on or off according to a second control signal. The second switch is connected in series between a second voltage and the output end, and is turned on or off according to a third control signal.

In an embodiment of the disclosure, the gate driving circuit further includes a control signal generator. The control signal generator sets the voltage difference to be compared with the first preset threshold voltage or the second preset threshold voltage to generate a comparison result and generates the first control signal, the second control signal, and the third control signal according to the comparison result.

In an embodiment of the disclosure, the control signal generator includes a comparator, a selector, and a counter. The comparator receives the voltage difference and a selected voltage, and generates the comparison result. The counter is coupled to the comparator, performs a counting action according to the comparison result, and generates the first control signal, the second control signal, and the third control signal.

In an embodiment of the disclosure, the counter performs the counting action between the first time point and the second time point to generate a count value, wherein the first time period is when the count value is smaller than a reference value and the second time period is when the count value is between the reference value and the maximum count value.

In an embodiment of the disclosure, the gate driving circuit further includes a voltage generator. The voltage generator generates a second voltage, a second reference voltage, a first preset threshold voltage, and a second preset threshold voltage according to an operation power.

In an embodiment of the disclosure, the voltage generator includes a voltage regulator and a reference voltage generator. The power adjuster generates the first voltage according to the operation power and generates a first power source and a second power source of the operational amplifier and the counter. The reference voltage generator generates the first preset threshold voltage, the second preset threshold voltage, and an adjustment voltage according to the operation power.

In an embodiment of the disclosure, the rectifier further includes a diode and a capacitance. The anode of the diode is coupled to the first end of the transistor and the cathode of the diode is coupled to the endpoint of the gate driving circuit receiving the operation power. The capacitance is coupled between the cathode of the diode and the second end of the transistor.

The alternator of the disclosure includes a rotor, a stator, and a plurality of the rectifiers above. Each of the rectifiers receives the corresponding AC input voltage as the input voltage to generate the rectified voltage together with the rectifier.

Based on the above, the rectifier of the disclosure maintains the voltage difference in the negative half cycle across the two ends of the transistor to be equal to the first reference voltage during the first time period, wherein the first reference voltage is generated as the product value of the equivalent resistance of the conducting transistor and the current flowing through the conducting transistor, and the voltage difference in the negative half cycle across the two ends of the transistor is maintained to be equal to the second reference voltage during the second time period, wherein the first reference voltage may be larger than, smaller than, or equal to the second reference voltage. As such, power loss in the rectifier may be reduced, thereby improving the working efficiency.

To make the aforementioned and other features of the disclosure more comprehensible, several embodiments accompanied with drawings are described in detail as follows.

DETAILED DESCRIPTION OF DISCLOSED EMBODIMENTS

Figure 1:
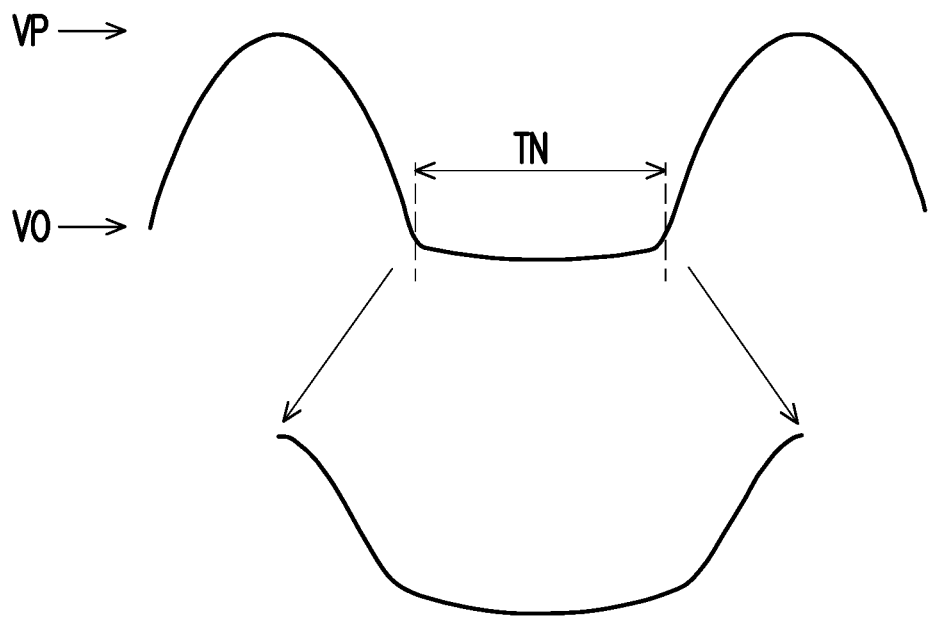
FIG. 1 illustrates a waveform of a conventional rectified voltage.
Figure 2:
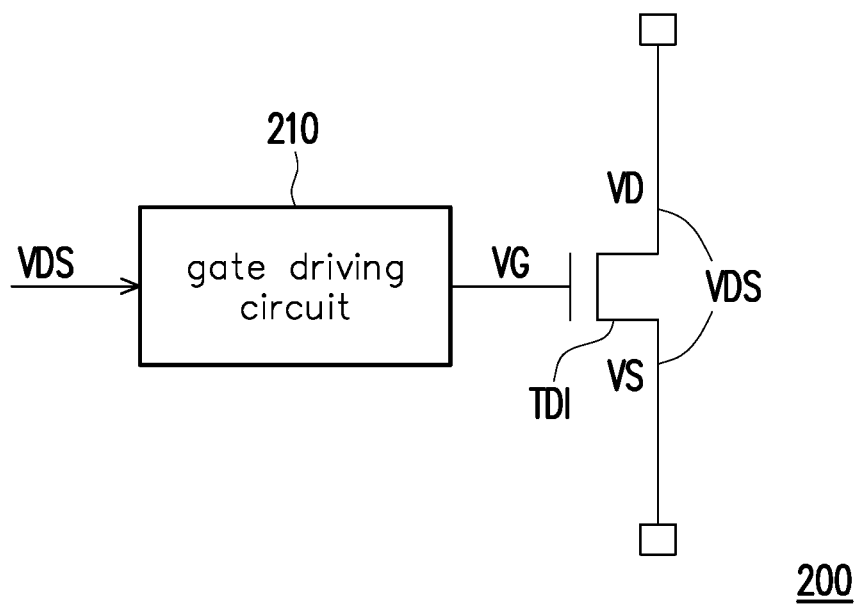
FIG. 2 is a schematic diagram of a rectifier according to an embodiment of the disclosure.

Please refer to FIG. 2. FIG. 2 is a schematic diagram of a rectifier according to an embodiment of the disclosure. A rectifier 200 includes a transistor TD1 and a gate driving circuit 210. The transistor TD1 has a first end for receiving an input voltage VS, a second end for generating a rectified voltage VD, and a control end for receiving a gate voltage VG. In the embodiment, the operation of the transistor TD1 is equivalent to a diode through the gate voltage VG. The first end of the transistor TD1 may be equivalent to an anode of the diode, and the second end of the transistor TD1 may be equivalent to a cathode of the diode.

The gate driving circuit 210 is coupled to the transistor TD1 and is used to provide the gate voltage VG. The gate driving circuit 210 receives a voltage difference VDS between the rectifier voltage VD and the input voltage VS, and generates the gate voltage VG according to the voltage difference VDS. Regarding the details of generating the gate voltage VG, the gate driving circuit 210 detects a variation of the voltage difference VDS. The gate driving circuit 210 detects an initial time point when the voltage difference VDS is smaller than a first preset threshold voltage and provides the gate voltage VG to turn on the transistor TD1 during a first time period after the initial time point. Also, under the condition that the transistor TD1 is turned on according to the gate voltage VG, the voltage difference VDS may be equal to a first reference voltage.

Next, the gate driving circuit 210 adjusts the equivalent resistance value provided by the transistor TD1 through adjusting the gate voltage VG during a second time period after the first time period and sets the voltage difference VDS to be equal to a second reference voltage, wherein the first reference voltage may be larger than, smaller than, or equal to the second reference voltage.

Please note that during the first time period, taking the transistor TD1 as a N-type transistor as an example, the gate driving circuit 210 may provide the gate voltage VG with a relatively high voltage to the control end of the transistor TD1, and set the transistor TD1 to be completely turned on. Under such situation, the first reference voltage above may be equal to the product of the conductive resistance of a completely or incompletely conducting transistor TD1 and the current flowing through the transistor TD1. If the transistor TD1 is in a completely conducting state, the conductive resistance of the transistor TD1 is extremely small, so the voltage difference VDS may be maintained to be equal to the first reference voltage close to 0 volts (V). During the second time period after the first time period, the gate driving circuit 210 may lower the voltage value of the gate voltage VG, and set the resistance of the transistor TD1 in the conducting state to increase. At this time, the gate voltage VG provided by the gate driving circuit 210 may set the voltage difference VDS to the second reference voltage which may be larger than, smaller than, or equal to the first reference voltage. In an embodiment, the second reference voltage may be approximately equal to −70 millivolts (mV).

On the other hand, the gate driving circuit 210 determines the initial time point through detecting whether the voltage difference VDS is smaller than the first preset threshold voltage or not. In the embodiment of the disclosure, the first preset threshold voltage may be smaller than the first reference voltage and the second reference voltage. When the voltage difference VDS falls below the first preset threshold voltage, the gate driving circuit 210 may determine the initial time point and initiate the adjustment mechanism of the gate voltage VG. In an embodiment, the first preset threshold voltage may be equal to −300 mV.

It can be known from the above description that in the rectifier 200 according to the embodiment of the disclosure, the voltage value range lower than 0V of the voltage difference VDS may be controlled by adjusting the gate voltage VG through the gate driving circuit 210, thereby effectively reducing unnecessary power loss.

Continuing from the above embodiment, after the second time period, the current flowing through the transistor TD1 becomes smaller as the input voltage changes. With the adjustment action of the gate voltage VG, the voltage difference VDS starts to rise during the third time period after the second time period. The gate driving circuit 210 may detect whether the voltage difference VDS rises from the second reference voltage to be equal to the second preset threshold voltage during the third time period and sets the second time point when the voltage difference VDS rises to be equal to the second preset threshold voltage. Furthermore, the gate driving circuit 210 sets the transistor TD1 to be cut off through adjusting the gate voltage VG after the second time point.

Figure 3A:
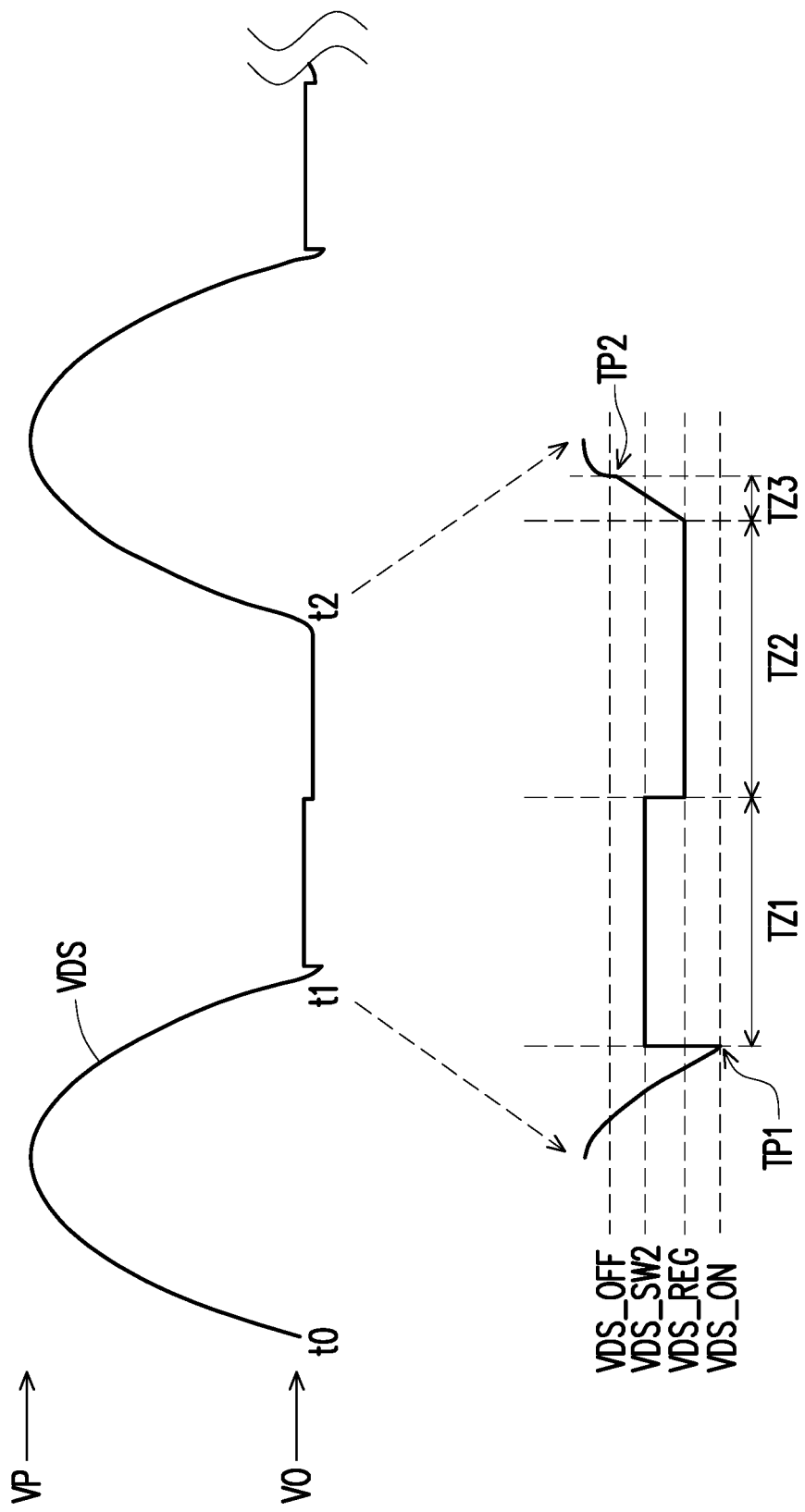
FIG. 3A is a schematic diagram of a waveform of a voltage difference according to an embodiment of the disclosure.

Please refer to FIG. 2 and FIG. 3A for the following. FIG. 3A is a schematic diagram of a waveform of a voltage difference according to an embodiment of the disclosure. The voltage difference VDS has a peak value of a voltage VP and has a base voltage V0. A positive half cycle of the voltage difference VDS is between time points t0 and t1, and a negative half cycle of the voltage difference VDS is between time points t1 and t2. After the time point t1, the gate driving circuit 210 detects whether the voltage difference VDS is lower than a first preset threshold voltage VDS_ON and sets an initial time point TP1 when the voltage difference VDS is lower than the first preset threshold voltage VDS_ON.

During the first time period TZ1 after the initial time point TP1, the gate driving circuit 210 may set the transistor TD1 to be turned on through providing the gate voltage VG and set the voltage difference VDS to be substantially maintained to be equal to a first reference voltage VDS_SW2. Here, the first reference voltage VDS_SW2 is the product of the conductive resistance of the transistor and the current flowing through the transistor.

Next, the gate driving circuit 210 may set the voltage difference VDS to be maintained as equal to a second reference voltage VDS_REG through adjusting the gate voltage VG during a second time period TZ2 after the first time period TZ1.

During a third time period TZ3 after the second time period TZ2, the voltage difference VDS starts to rise as the current flowing through the transistor TD1 decreases and the adjustment action of the gate voltage VG. Moreover, the gate driving circuit 210 may detect whether the voltage difference VDS is larger than a second preset threshold voltage VDS_OFF and sets a second time point TP2 when the voltage difference VDS is larger than the second preset threshold voltage VDS_OFF. The gate driving circuit 210 sets the transistor TD1 to be cut off through adjusting the gate voltage VG after the second time point TP2.

In the embodiment, the second preset threshold voltage VDS_OFF is larger than the first reference voltage VDS_SW2, the first reference voltage VDS_SW2 is larger than the second reference voltage VDS_REG, and the second reference voltage VDS_REG is larger than the first preset threshold voltage VDS_ON.

Figure 3B:
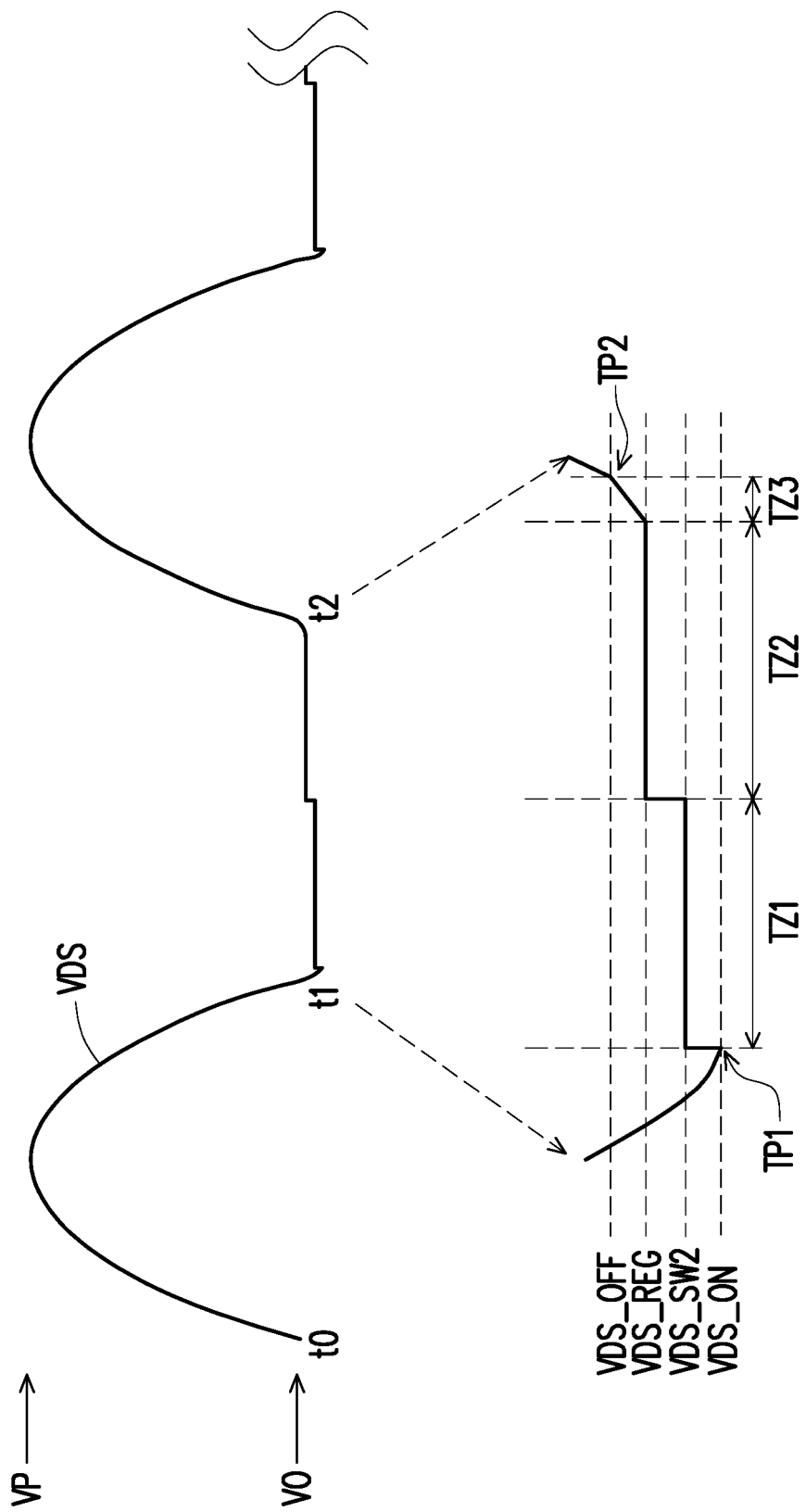
FIG. 3B and FIG. 3C are schematic diagrams of waveforms of voltage differences according to different embodiments of the disclosure.
Figure 3C:
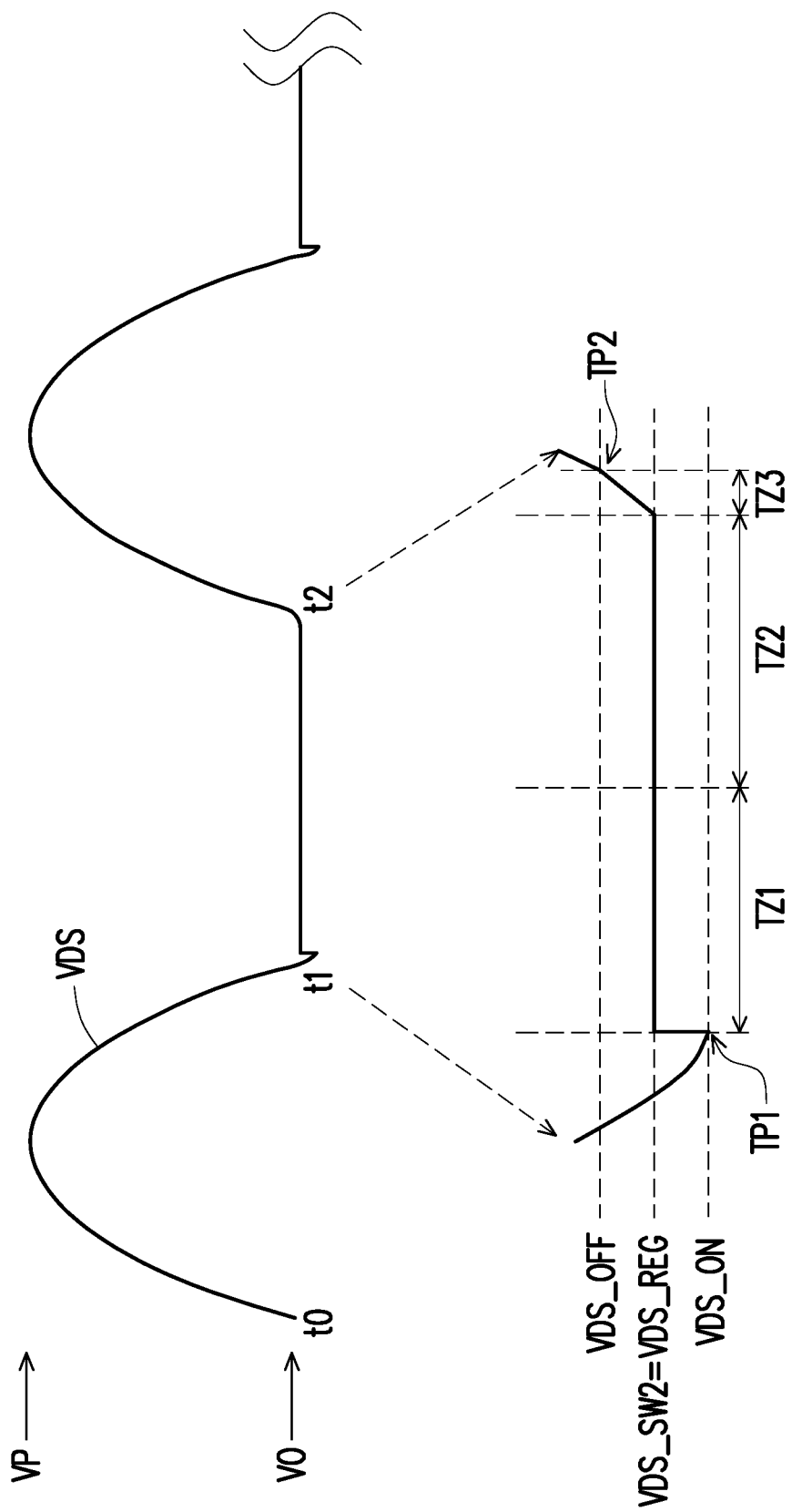

In addition, please refer to FIG. 3B and FIG. 3C. FIG. 3B and FIG. 3C are schematic diagrams of waveforms of voltage differences according to different embodiments of the disclosure. Unlike the embodiment of FIG. 3A, in FIG. 3B, the first reference voltage VDS_SW2 is smaller than the second reference voltage VDS_REG. In FIG. 3C, the first reference voltage VDS_SW2 is equal to the second reference voltage VDS_REG.

Figure 4A:
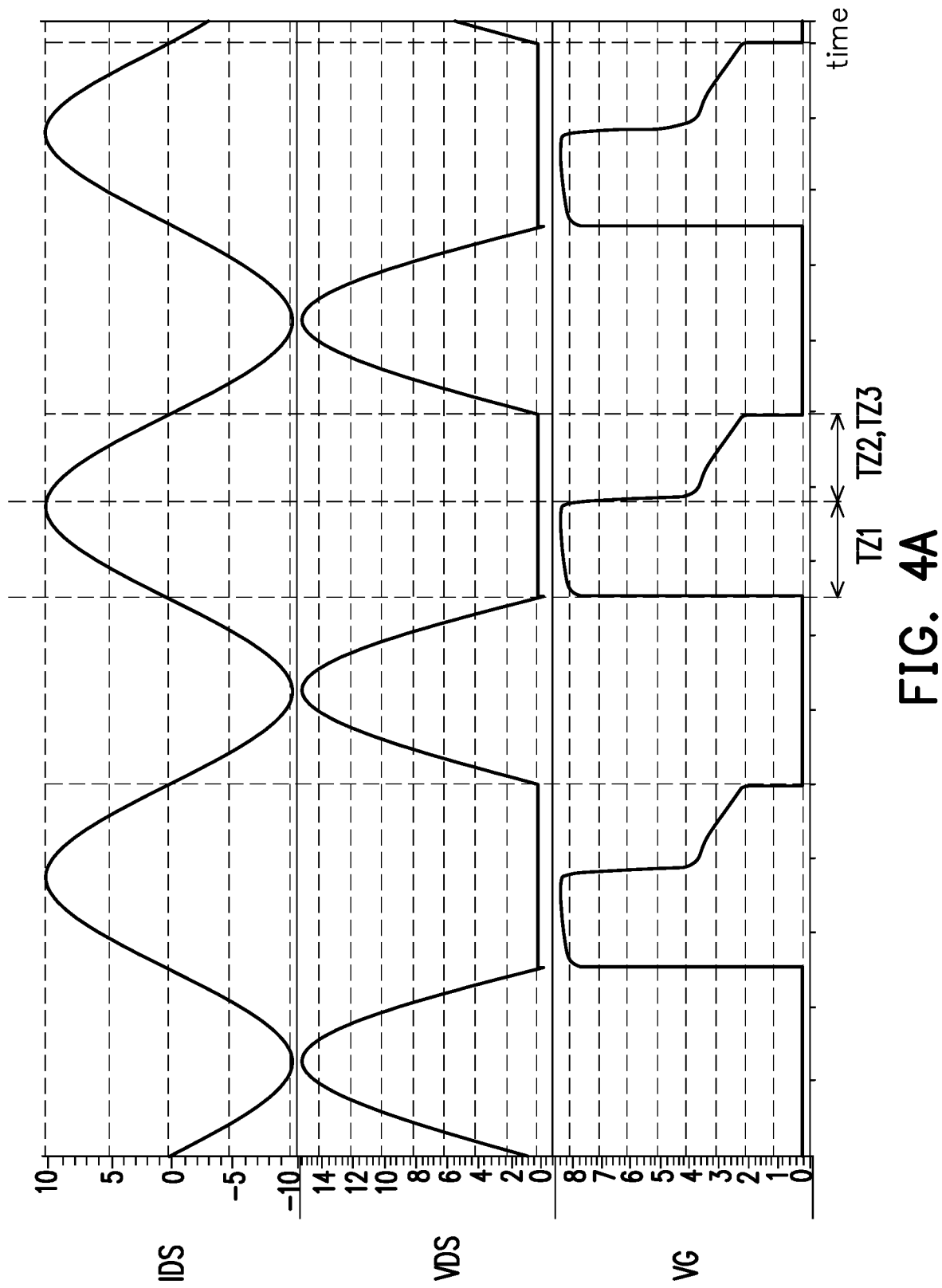
FIG. 4A is a schematic diagram of waveforms of a voltage difference, a transistor current, and a gate voltage according to an embodiment of the disclosure.
Figure 4B:
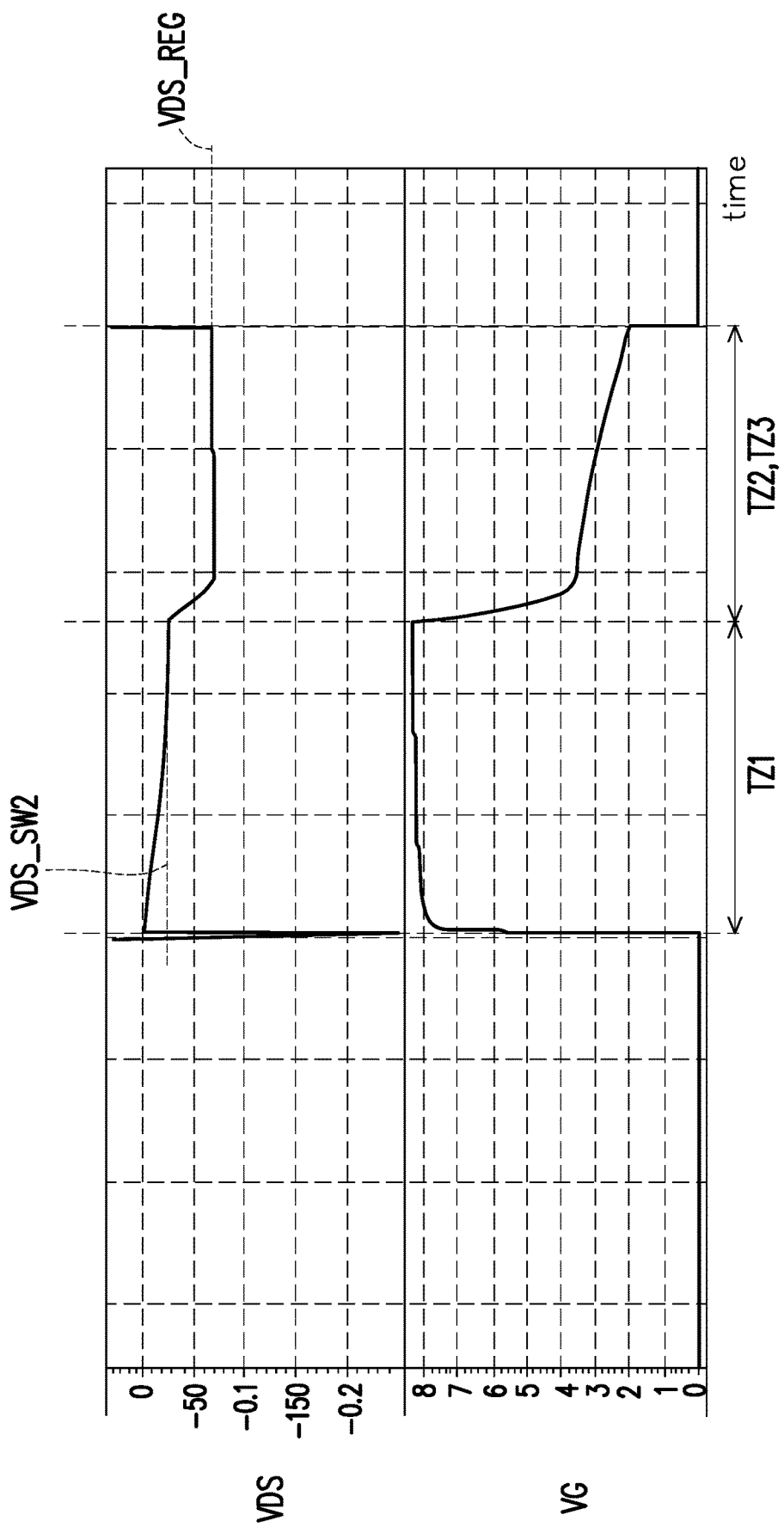
FIG. 4B is a partially enlarged diagram of the waveforms of the voltage difference and the gate voltage in FIG. 4A.

Please refer to FIG. 4A and FIG. 4B for the following. FIG. 4A is a schematic diagram of waveforms of a voltage difference, a transistor current, and a gate voltage according to an embodiment of the disclosure. FIG. 4B is a partially enlarged diagram of the waveforms of the voltage difference and the gate voltage in FIG. 4A. In FIG. 4A, during the first time period TZ1, a gate voltage generating circuit adjusts the gate voltage VG to have a relatively high voltage value, thereby setting the transistor to be completely turned on, and sets the voltage difference VDS to be substantially maintained as equal to the first reference voltage. Between the second time period TZ2 and the third time period TZ3, the gate voltage generating circuit sets the voltage difference VDS to be equal to the second reference voltage during the second time period and sets the voltage difference VDS to start rising slightly during the third time period through adjusting the gate voltage VG. The gate voltage generating circuit provides the gate voltage VG with a relatively low voltage to turn off the transistor after the third time period TZ3 ends. In FIG. 4A, a transistor current IDS changes periodically.

Regarding the relationship between the first reference voltage and the second reference voltage, reference may be made to FIG. 4B. In FIG. 4B, the voltage difference VDS may be equal to the first reference voltage VDS_SW2 during the first time period TZ1 through the gate voltage VG having a relatively high voltage. It is worth mentioning that in FIG. 4B, the voltage difference VDS does not immediately equal to the first reference voltage VDS_SW2 during the first time period TZ1. Instead, the voltage difference VDS gradually approaches the first reference voltage VDS_SW2 due to parasitic capacitance effect in circuit components. Basically, the voltage difference VDS may be substantially equal to the first reference voltage VDS_SW2 during the first time period TZ1.

During the second time period TZ2, the gate driving circuit provides a gradually decreasing gate voltage VG and sets the voltage difference VDS to be substantially equal to the second reference voltage VDS_REG during the second time period TZ1.

In FIG. 4A and FIG. 4B, a length of the third time period TZ3 with respect to a length of the second time period TZ2 is very short.

Figure 4C:
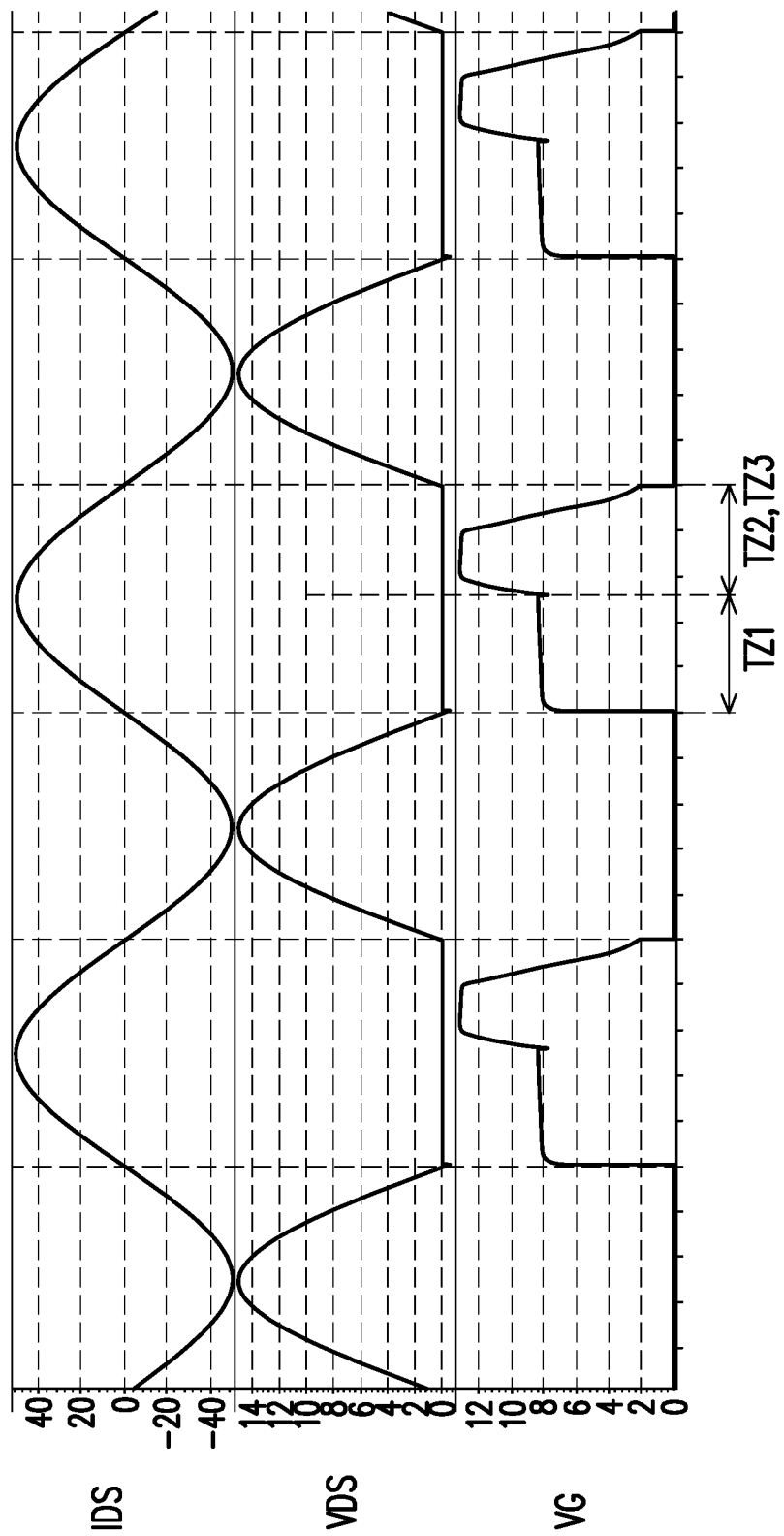
FIG. 4C is a schematic diagram of waveforms of a voltage difference, a transistor current, and a gate voltage according to another embodiment of the disclosure.
Figure 4D:
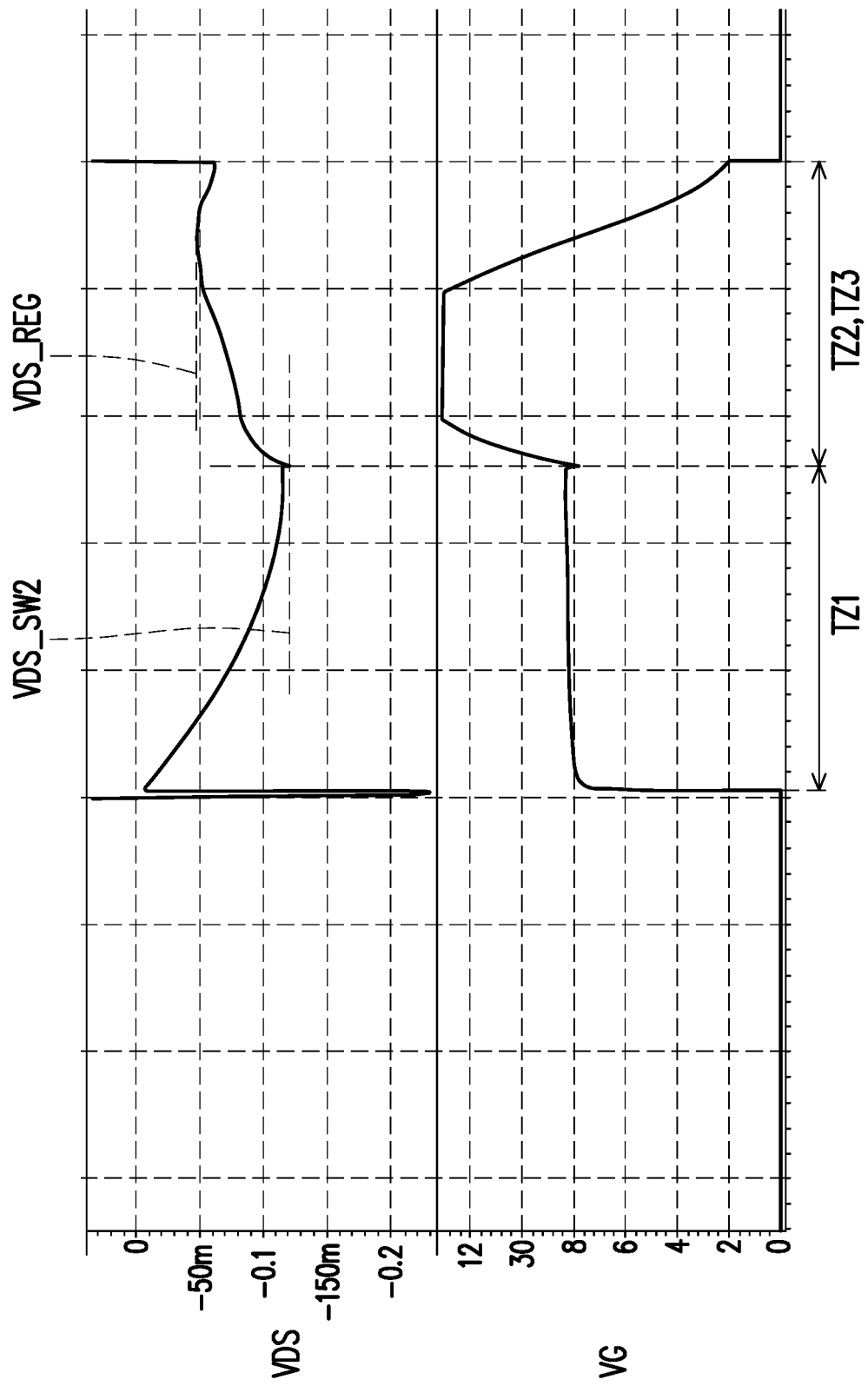
FIG. 4D is a partially enlarged diagram of the waveforms of the voltage difference and the gate voltage in FIG. 4C.

Please refer to FIG. 4C and FIG. 4D for the following. FIG. 4C is a schematic diagram of waveforms of a voltage difference, a transistor current, and a gate voltage according to another embodiment of the disclosure. FIG. 4D is a partially enlarged diagram of the waveforms of the voltage difference and the gate voltage in FIG. 4C. In FIG. 4C, during the first time period TZ1, the gate voltage generating circuit adjusts the gate voltage VG to have a relatively low (relative to the second time period TZ2) voltage value, thereby setting the transistor to be partially turned on, and sets the voltage difference VDS to be substantially equal to the first reference voltage. Between the second time period TZ2 and the third time period TZ3, the gate voltage generating circuit sets the voltage difference VDS to be equal to the second reference voltage during the second time period TZ2 and sets the voltage difference VDS to start rising slightly during the third time period TZ3 through increasing the gate voltage VG. It can be clearly known from FIG. 4D that the voltage difference VDS is substantially equal to the first reference voltage VDS_SW2 during the first time period TZ1 and is substantially equal to the second reference voltage VDS_REG during the second time period TZ2, wherein the first reference voltage VDS_SW2 is smaller than the second reference voltage VDS_REG.

Similarly, in FIG. 4D, the voltage difference VDS does not immediately equal to the first reference voltage VDS_SW2 during the first time period TZ1. Instead, the voltage difference VDS gradually approaches the first reference voltage VDS_SW2 due to parasitic capacitance effect in circuit components. Basically, the voltage difference VDS may be substantially equal to the first reference voltage VDS_SW2 during the first time period TZ1. The voltage difference VDS also does not immediately equal to the second reference voltage VDS_REG during the second time period TZ2. Instead, the voltage difference VDS gradually approaches the second reference voltage VDS_REG due to parasitic capacitance effect in circuit components. Basically, the voltage difference VDS may be substantially equal to the second reference voltage VDS_REG during the second time period TZ2.

Figure 5:
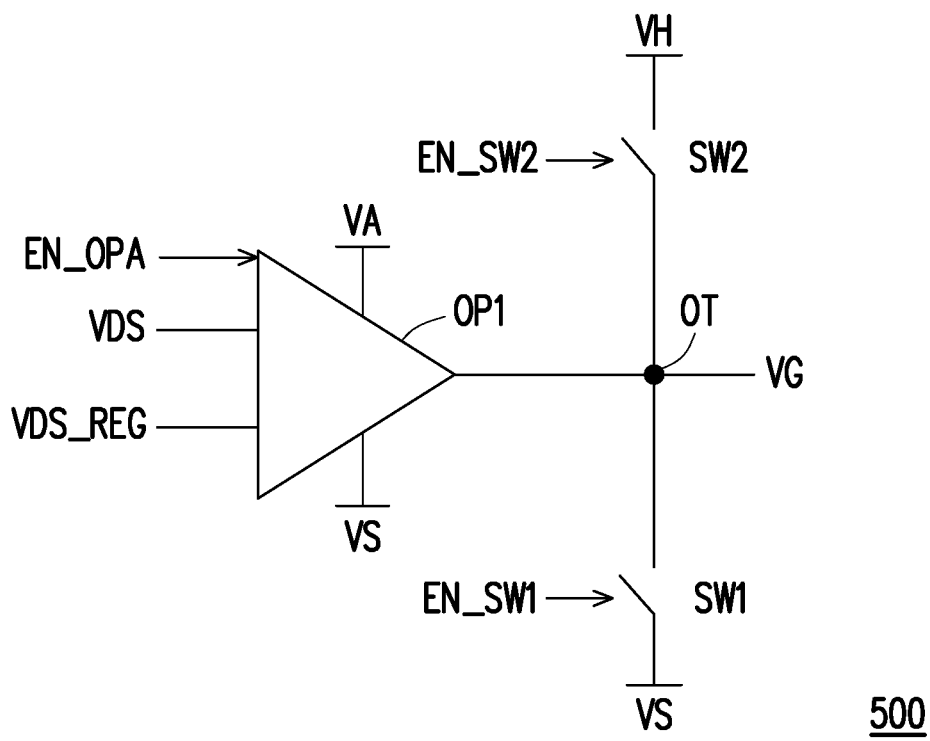
FIG. 5 is a schematic diagram of a gate driving circuit according to an embodiment of the disclosure.

Please refer to FIG. 5. FIG. 5 is a schematic diagram of a gate driving circuit according to an embodiment of the disclosure. A gate driving circuit 500 includes an operational amplifier OP1, a switch SW1, and a switch SW2. The operational amplifier OP1 receives the voltage difference VDS and the adjustment voltage as the second reference voltage VDS_REG, and generates the gate voltage VG at an output end OT according to a control signal EN_OPA. In addition, the operational amplifier OP1 receives a power VA as the working power source and receives a voltage VS as the reference ground voltage. The switch SW2 is connected in series between the voltage VH and the output end OT. The switch SW2 is turned on or off according to the control signal EN_SW2. The switch SW1 is connected in series between the voltage VS and the output end OT. The switch SW1 is turned on or off according to the control signal EN_SW1.

In terms of action details, the gate driving circuit 500 sets the operational amplifier OP1 to be disabled through the control signal EN_OPA after the initial time point when the voltage difference VDS is smaller than the first preset threshold voltage (during the first time period) and sets the switch SW2 to be turned on through the control signal EN_SW2 to raise the gate voltage VG to the voltage VH. At the same time, the switch SW1 is cut off according to the control signal EN_SW1. Next, during the second time period after the first time period, the gate driving circuit 500 sets the switches SW2 and SW1 to be respectively cut off through the control signals EN_SW2 and EN_SW1, and sets the operational amplifier OP1 to be activated through the control signal EN_OPA. During the second time period, the operational amplifier OP1 provides the gate voltage VG at the output end OT through controlling the voltage difference VDS to be equal to the second reference voltage VDS_REG. Next, during the third time period, the gate driving circuit 500 sets the switch SW2 to be cut off through the control signals EN_SW2 and EN_OPA respectively, and sets the operational amplifier OP1 to be disabled. Also, during the third time period, the gate driving circuit 500 sets the switch SW1 to be turned on through the control signal EN_SW1. Through the conducted switch SW1, the gate voltage VG is pulled down to be equal to the voltage VS and the transistor is cut off.

Figure 6:
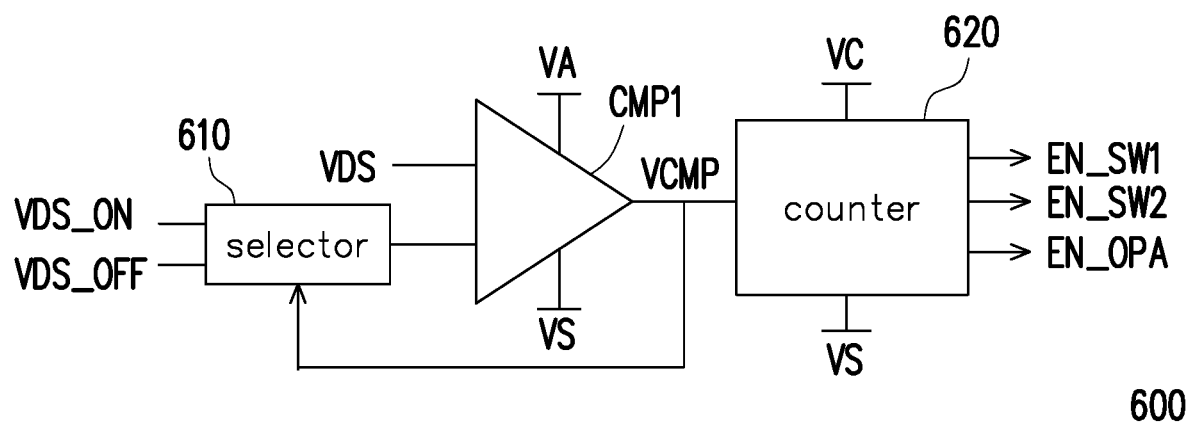
FIG. 6 illustrates implementing a control signal generator according to an embodiment of the disclosure.

Regarding the above embodiment, the control signals EN_OPA, EN_SW1, and EN_SW2 may be generated through setting a control signal generator in the gate driving circuit 500. For the implementation of the control signal generator, reference may be made to FIG. 6. In FIG. 6, a control signal generator 600 includes a selector 610, a comparator CMP1, and a counter 620. The selector 610 receives a first preset threshold voltage VDS_ON and a second preset threshold voltage VDS_OFF, and is used to select the first preset threshold voltage VDS_ON or the second preset threshold voltage VDS_OFF to be provided to the comparator CMP1. The comparator CMP1 is coupled to the selector 610 and sets the voltage difference VDS to be compared with one of the first preset threshold voltage VDS_ON and the second preset threshold voltage VDS_OFF to generate a comparison result VCMP. It is worth noting that the comparison result VCMP may be fed back to the selector 610 to set the selector 610 to select one of the first preset threshold voltage VDS_ON and the second preset threshold voltage VDS_OFF according to the comparison result VCMP for output. In details, under the initial state, the selector 610 selects the first preset threshold voltage VDS_ON to output to the comparator CMP1. The comparator CMP1 sets the voltage difference VDS to be compared with the first preset threshold voltage VDS_ON and sets the selector 610 to change to selecting the second preset threshold voltage VDS_OFF to output to the comparator CMP1 through adjusting the comparison result VCMP when the voltage difference VDS is smaller than the first preset threshold voltage VDS_ON (the initial time point).

Continuing from the above embodiment, next, the comparator CMP1 sets the voltage difference VDS to be compared with the second preset threshold voltage VDS_OFF and changes the selector 610 to reselect the first preset threshold voltage VDS_ON to output to the comparator CMP1 through adjusting the comparison result VCMP when the voltage difference VDS is larger than the second preset threshold voltage VDS_OFF (the second time point).

Figure 7:
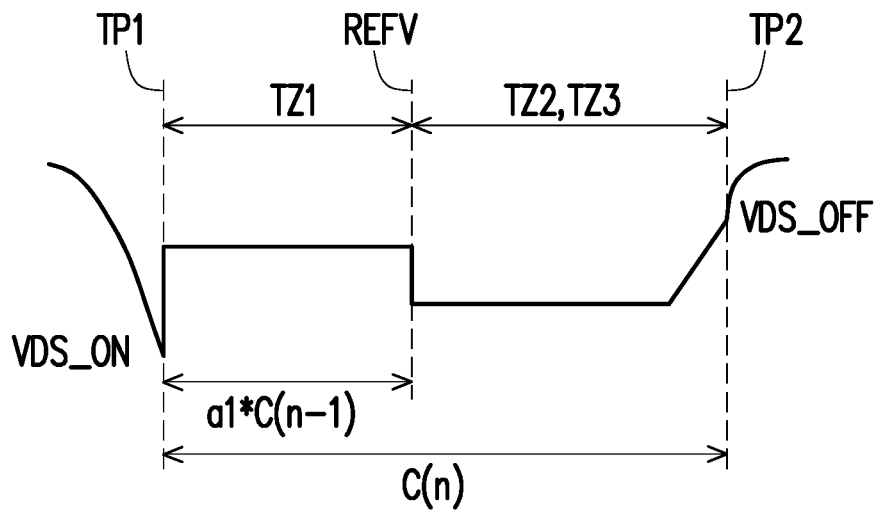
FIG. 7 is a schematic diagram of implementing a counting action of a counter according to an embodiment of the disclosure.

On the other hand, regarding the counting action of the counter 620, please refer to FIG. 6 and FIG. 7 at the same time. FIG. 7 is a schematic diagram of implementing a counting action of a counter according to an embodiment of the disclosure. The counter 620 is coupled to the comparator CMP1 and performs the counting action according to the comparison result VCMP. The counting action of the counter 620 starts at the initial time point TP1 and ends at the second time point TP2. The counting action of the counter 620 may produce a gradually changing (incremental or decremental) count value. Taking an incremental counting action as an example, the counter 620 may set the gate driving circuit to operate during the first time period TZ1 when the count value is smaller than a reference value REFV and set the gate driving circuit to operate during the second interval TZ2 or the third time period TZ3 when the count value is between the reference value REFV and a maximum count value C(n). Moreover, the counter 620 may generate the corresponding control signals EN_OPA, EN_SW1, and EN_SW2 according to whether the gate driving circuit operates during the first time period TZ1, the second time period TZ2, or the third time period TZ3.

Regarding the setting of the reference value REFV above, the reference value REFV may be set as the product of the maximum count value C(n) of the counting action and a ratio value a1, wherein the ratio value a1 is larger than or equal to 0 and is smaller than or equal to 1. The C(n−1) in the drawing is the length of the initial time point TP1 to the second time point TP2 during the previous cycle.

Figure 8:
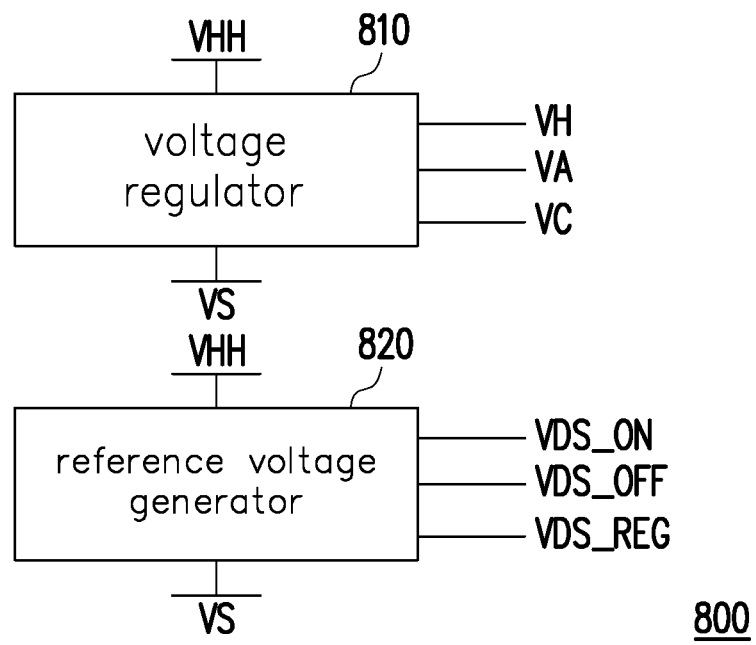
FIG. 8 illustrates implementing a voltage generator according to an embodiment of the disclosure.

On the other hand, in the embodiment regarding FIG. 5 above, the voltage VH, the second reference voltage VDS_REG, the first preset threshold voltage VDS_ON, the second preset threshold voltage VDS_OFF, the power VA, and the power VC may be generated through setting a voltage generator in the driving circuit 500. Regarding the implementation of the voltage generator, reference may be made to FIG. 8. In FIG. 8, a voltage generator 800 includes a voltage regulator 810 and a reference voltage generator 820. The voltage regulator 810 receives an operation power VHH and performs a voltage adjustment action according to the operation power VHH to generate the voltage VH, the power VA, and the power VC. The reference voltage generator 820 also receives the operation power VHH, which is used to generate the second reference voltage VDS_REG, the first preset threshold voltage VDS_ON, and the second preset threshold voltage VDS_OFF.

The hardware structure of the voltage regulator 810 and the reference voltage generator 820 may be constructed by applying any form of voltage generating circuit known by persons with ordinary skill in the art and is not limited thereto.

Figure 9:
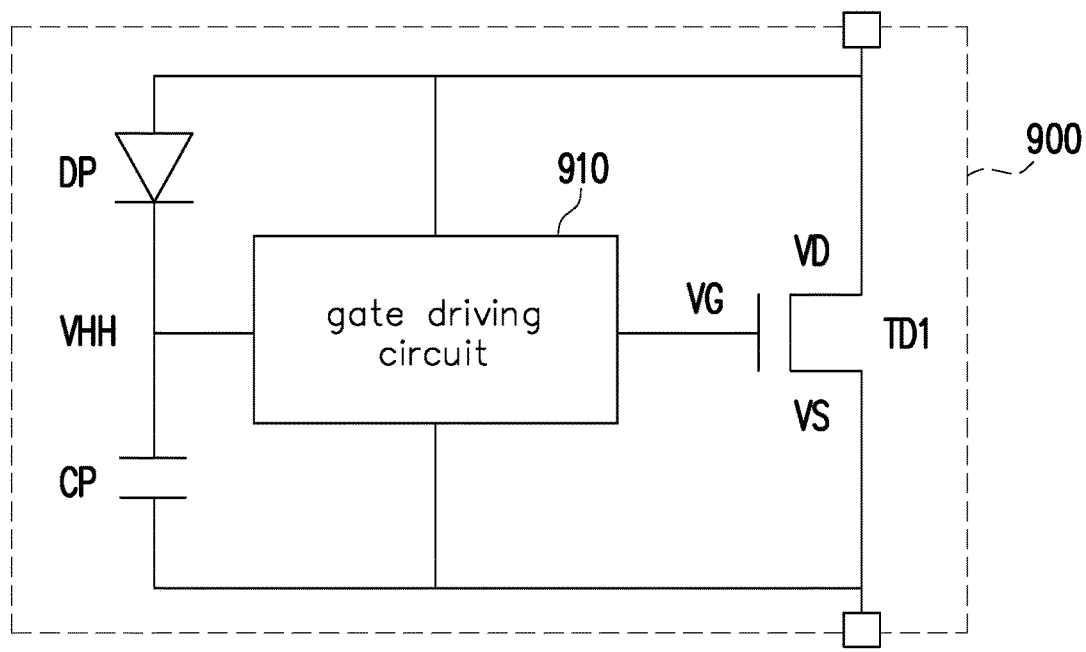
FIG. 9 is a schematic diagram of a rectifier according to another embodiment of the disclosure.

Please refer to FIG. 9 for the following. FIG. 9 is a schematic diagram of a rectifier according to another embodiment of the disclosure. A rectifier 900 includes a transistor TD1, a gate driving circuit 910, a diode DP, and a capacitance CP. The gate driving circuit 910 may be implemented using the gate driving circuit 500 above. The anode of the diode DP is coupled to the first end of the transistor TD1 and the cathode of the diode DP is coupled to the endpoint of the gate driving circuit 910 receiving the operation power VHH. The capacitance CP is coupled between the cathode of the diode DP and the second end of the transistor TD1.

Figure 10:
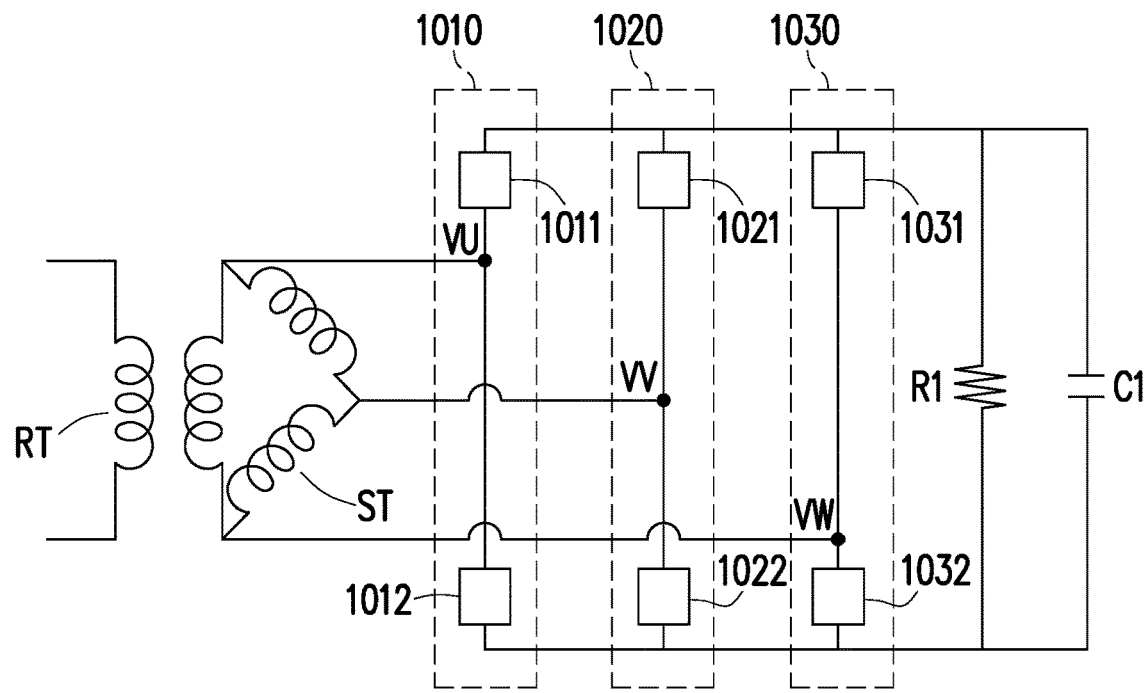
FIG. 10 is a schematic diagram of an alternator according to an embodiment of the disclosure.

Please refer to FIG. 10. FIG. 10 is a schematic diagram of an alternator according to an embodiment of the disclosure. An alternator 1000 includes a rotor RT, a stator ST, and a plurality of rectifiers 1011-1032. In the embodiment, the stator ST generates a plurality of phase voltages VU, VV, and VW. The phase voltages VU, VV, and VW respectively provides to a plurality of rectifier circuits 1010, 1020, and 1030 with different phases. The rectifier circuit 1010 includes rectifiers 1011 and 1012 coupled in series, the rectifier circuit 1020 includes rectifiers 1021 and 1022 coupled in series, and the rectifier circuit 1030 includes rectifiers 1031 and 1032 coupled in series. In the embodiment, the alternator 1000 includes a resistance R1 (which is an equivalent load or an equivalent resistance of a rechargeable battery) coupled in parallel and a capacitance C1 which is an equivalent charging capacitance used to generate a rectified output voltage close to a DC.

In summary, the disclosure generates the gate voltage through the gate driving circuit and controls the voltage value of the voltage difference in the negative half cycle across two ends of the transistor through the gate voltage. As a result, the power loss which may be generated by the rectifier can be reduced, thereby improving the working efficiency.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A rectifier, comprising:
   a transistor having a first end for receiving an input voltage, a second end for generating a rectified voltage, and a control end for receiving a gate voltage; and
   a gate driving circuit, coupled to the transistor, for generating the gate voltage according to a voltage difference between the rectified voltage and the input voltage,
   wherein the gate driving circuit detects an initial time point when the voltage difference is smaller than a first preset threshold voltage, provides the gate voltage to turn on the transistor during a first time period after the initial time point, and sets the voltage difference to be substantially equal to a first reference voltage; the gate driving circuit sets the voltage difference to be substantially equal to a second reference voltage through adjusting the gate voltage during a second time period after the first time period.

2. The rectifier according to claim 1, wherein the first reference voltage is larger than, smaller than, or equal to the second reference voltage.

3. The rectifier according to claim 1, wherein the first reference voltage is equal to a product of a conductive resistance of the transistor and a current flowing through the transistor.

4. The rectifier according to claim 1, wherein the gate driving circuit detects a second time point when the voltage difference rises from the second reference voltage to a second preset threshold voltage during a third time period after the second time period and adjusts the gate voltage to set the transistor to be cut off after the second time point.

5. The rectifier according to claim 4, wherein the gate driving circuit comprises:
   an operational amplifier for receiving the voltage difference and an adjustment voltage to generate the gate voltage at an output end according to a first control signal;
   a first switch, connected in series between a first voltage and the output end, to be turned on or off according to a second control signal; and
   a second switch, connected in series between a second voltage and the output end, to be turned on or off according to a third control signal, wherein
   the adjustment voltage is equal to the second reference voltage.

6. The rectifier according to claim 5, wherein the gate driving circuit further comprises:
   a control signal generator comparing the voltage difference with the first preset threshold voltage or the second preset threshold voltage to generate a comparison result, and to generate the first control signal, the second control signal, and the third control signal according to the comparison result.

7. The rectifier according to claim 6, wherein the control signal generator comprises:
   a comparator for receiving the voltage difference and a selected voltage, and for generating the comparison result;
   a selector, coupled to the comparator, for selecting the first preset threshold voltage or the second preset threshold voltage to generate the selected voltage; and
   a counter, coupled to the comparator, for performing a counting action according to the comparison result and for generating the first control signal, the second control signal, and the third control signal.

8. The rectifier according to claim 7, wherein the counter performs the counting action between the first time point and the second time point to generate a count value,
   wherein the first time period is when the count value is smaller than a reference value, and the second time period or the third time period is when the count value is between the reference value and a maximum count value.

9. The rectifier according to claim 7, wherein the gate driving circuit further comprises:
   a voltage generator for generating the second voltage, the second reference voltage, the first preset threshold voltage, and the second preset threshold voltage according to an operation power.

10. The rectifier according to claim 9, wherein the voltage generator comprises:
    a voltage regulator for generating the second voltage according to the operation power and for generating a first power and a second power of the operational amplifier and the counter; and a reference voltage generator for generating the first preset threshold voltage, the second preset threshold voltage, and the adjustment voltage according to the operation power.

11. The rectifier according to claim 1, further comprising:
a diode having an anode coupled to the first end of the transistor and a cathode coupled to an endpoint of the gate driving circuit receiving an operation power; and
a capacitance coupled between the cathode of the diode and the second end of the transistor.

12. An alternator, comprising:
a rotor;
a stator, coupled to the rotor, for generating a plurality of alternating current (AC) input voltages; and
a plurality of rectifiers according to claim 1, wherein each of the plurality of rectifiers receives a corresponding AC input voltage as an input voltage and the plurality of rectifiers jointly generate a rectified voltage.

\* \* \* \* \*